United States Patent
Korevaar et al.

(10) Patent No.: US 8,728,855 B2
(45) Date of Patent: May 20, 2014

(54) METHOD OF PROCESSING A SEMICONDUCTOR ASSEMBLY

(71) Applicant: First Solar, Inc, Tempe, AZ (US)

(72) Inventors: Bastiaan Arie Korevaar, Schenectady, NY (US); Faisal Razi Ahmad, Niskayuna, NY (US)

(73) Assignee: First Solar, Inc., Tempe, AZ (US)

( * ) Notice: Subject to any disclaimer, the term of this patent is extended or adjusted under 35 U.S.C. 154(b) by 0 days.

(21) Appl. No.: 13/630,231

(22) Filed: Sep. 28, 2012

(65) Prior Publication Data

US 2014/0094025 A1  Apr. 3, 2014

(51) Int. Cl.
*H01L 21/00* (2006.01)

(52) U.S. Cl.
USPC ............... 438/95; 438/102; 257/E21.068

(58) Field of Classification Search
USPC ............ 438/86, 590; 257/E21.07, E21.071, 257/E21.073, E21.075
See application file for complete search history.

(56) References Cited

U.S. PATENT DOCUMENTS

| 5,541,118 | A  | 7/1996  | Levi et al.    |
|-----------|----|---------|----------------|
| 6,137,048 | A  | 10/2000 | Wu et al.      |
| 7,632,701 | B2 | 12/2009 | Dhere et al.   |
| 8,044,477 | B1 | 10/2011 | Zhong et al.   |
| 2007/0163644 | A1 | 7/2007  | Van Duren et al. |
| 2009/0130796 | A1 | 5/2009  | Taunier et al. |
| 2009/0242029 | A1 | 10/2009 | Paulson et al. |
| 2009/0305449 | A1 | 12/2009 | Bollman et al. |
| 2010/0282319 | A1 | 11/2010 | Taliani et al. |
| 2011/0229989 | A1 | 9/2011  | Wieting        |
| 2011/0294254 | A1 | 12/2011 | Jackrel et al. |
| 2011/0315220 | A1 | 12/2011 | Korevaar et al. |
| 2011/0315221 | A1 | 12/2011 | Hunt et al.    |
| 2012/0028407 | A1 | 2/2012  | Feldman-Peabody et al. |
| 2012/0052621 | A1 | 3/2012  | Feldman-Peabody et al. |
| 2012/0061235 | A1 | 3/2012  | Feldman-Peabody |

FOREIGN PATENT DOCUMENTS

WO   2007101136 A2   9/2007

OTHER PUBLICATIONS

Herndon et al., "Evidence for Grain-Boundary-Assisted Diffusion of Sulfur in Polycrystalline CdS/CdTeHeterojunctions", Applied Physics Letters, Nov. 1999, vol. 75, Issue 22, pp. 3503-3505.
Gretener et al., "CdTe/CdS thin film solar cells grown in substrate configuration", Progress in Photovoltaics: Research and Applications, 2012, 7 pages.
International Search Report and Written Opinion, Application No. PCT/US2013/61793 dated Feb. 19, 2014.

*Primary Examiner* — Cheung Lee
(74) *Attorney, Agent, or Firm* — MacMillan, Sobanski & Todd, LLC

(57) ABSTRACT

A method for processing a semiconductor assembly is presented. The method includes: (a) contacting at least a portion of a semiconductor assembly with a chalcogen source, wherein the semiconductor assembly comprises a semiconductor layer comprising a semiconductor material disposed on a support; (b) introducing a chalcogen from the chalcogen source into at least a portion of the semiconductor material; and (c) disposing a window layer on the semiconductor layer after the step (b).

17 Claims, 3 Drawing Sheets

METHOD OF PROCESSING A SEMICONDUCTOR ASSEMBLY

BACKGROUND

The invention generally relates to a method of processing a semiconductor assembly. More particularly, the invention relates to a method of processing a semiconductor assembly suitable for use in photovoltaic devices with substrate configuration.

Thin film solar cells or photovoltaic devices typically include a plurality of semiconductor layers disposed on a transparent substrate, wherein one layer serves as a window layer and a second layer serves as an absorber layer. The window layer allows the penetration of solar radiation to the absorber layer, where the optical energy is converted to usable electrical energy. The window layer further functions to form a heterojunction (p-n junction) in combination with an absorber layer. The window layer desirably is thin enough and has a wide enough bandgap (2.4 eV or more) to transmit most available light through to the absorber layer.

Cadmium telluride/cadmium sulfide (CdTe/CdS) heterojunction-based photovoltaic cells are one such example of thin film solar cells, where CdS functions as the window layer. Typically, the CdTe/CdS-based photovoltaic cells include a superstrate configuration (formed by disposing the absorber layer on the window layer) or a substrate configuration (formed by disposing the window layer on the absorber layer).

However, thin film photovoltaic devices may suffer from low efficiency values because of one or both of low short-circuit current ($J_{SC}$) or low open-circuit voltage ($V_{OC}$). Typical methods to increase the $J_{SC}$ in superstrate configuration may however also adversely affect the $V_{OC}$. Thus it may be desirable to alter the band gap profile of the absorber layer to increase the $J_{SC}$ without affecting the $V_{OC}$.

BRIEF DESCRIPTION OF THE INVENTION

Embodiments of the present invention are included to meet these and other needs. One embodiment is a method. The method includes: (a) contacting at least a portion of a semiconductor assembly with a chalcogen source, wherein the semiconductor assembly includes a semiconductor layer including a semiconductor material disposed on a support; (b) introducing a chalcogen from the chalcogen source into at least a portion of the semiconductor material; and (c) disposing a window layer on the semiconductor layer after the step (b).

One embodiment is a method. The method includes (a) contacting at least a portion of a semiconductor assembly with a chalcogen source, wherein the semiconductor assembly includes a semiconductor layer including a semiconductor material disposed on a support; and (b) disposing a layer including the chalcogen source in contact with at least a portion of the semiconductor layer. The method further includes: (c) introducing a chalcogen from the chalcogen source into at least a portion of the semiconductor material; and (d) disposing a window layer on the semiconductor layer after the step (c), wherein the window layer is substantially free of cadmium sulfide.

One embodiment is a method. The method includes (a) contacting at least a portion of a semiconductor assembly with a chalcogen source, wherein the semiconductor assembly includes a semiconductor layer including a semiconductor material disposed on a support; and (b) disposing a layer including the sulfur source in contact with at least a portion of the semiconductor layer. The method further includes: (c) introducing sulfur from the sulfur source into at least a portion of the semiconductor material; (d) removing the sulfur source; and (e) disposing a window layer on the semiconductor layer after the step (d), wherein the window layer is substantially free of cadmium sulfide.

DRAWINGS

These and other features, aspects, and advantages of the present invention will become better understood when the following detailed description is read with reference to the accompanying drawings, wherein.

DETAILED DESCRIPTION

Figure 1:
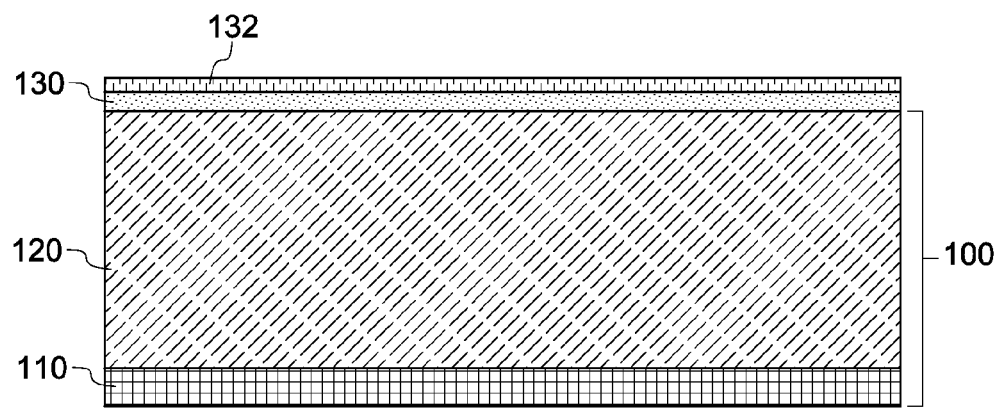
FIG. 1 is a schematic of a semiconductor assembly, in accordance with some embodiments of the invention.

As discussed in detail below, some of the embodiments of the invention relate to a method for processing a semiconductor assembly. More particularly, some of the embodiments of the invention relate to methods for processing a semiconductor assembly suitable for use in photovoltaic devices with substrate configuration.

In the following specification and the claims, the singular forms "a", "an" and "the" include plural referents unless the context clearly dictates otherwise. As used herein, the term "or" is not meant to be exclusive and refers to at least one of the referenced components (for example, a layer) being present and includes instances in which a combination of the referenced components may be present, unless the context clearly dictates otherwise.

Approximating language, as used herein throughout the specification and claims, may be applied to modify any quantitative representation that could permissibly vary without resulting in a change in the basic function to which it is related. Accordingly, a value modified by a term or terms, such as "about", and "substantially" is not to be limited to the precise value specified. In some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

The terms "transparent region" and "transparent layer" as used herein, refer to a region or a layer that allows an average transmission of at least 70% of incident electromagnetic radiation having a wavelength in a range from about 350 nm to about 850 nm.

As used herein, the term "layer" refers to a material disposed on at least a portion of an underlying surface in a continuous or discontinuous manner. Further, the term "layer" does not necessarily mean a uniform thickness of the disposed material, and the disposed material may have a uniform or a variable thickness. As used herein, the term "disposed on" refers to layers disposed directly in contact with each other or indirectly by having intervening layers therebetween, unless otherwise specifically indicated. The term "adjacent" as used herein means that the two layers are disposed contiguously and are in direct contact with each other.

In the present disclosure, when a layer is being described as "on" another layer or substrate, it is to be understood that the layers can either be directly contacting each other or have one (or more) layer or feature between the layers. Further, the term "on" describes the relative position of the layers to each other and does not necessarily mean "on top of" since the relative position above or below depends upon the orientation of the device to the viewer. Moreover, the use of "top," "bottom," "above," "below," and variations of these terms is made for convenience, and does not require any particular orientation of the components unless otherwise stated.

As discussed in detail below, some embodiments of the invention are directed to a method of processing a semiconductor assembly. The method is described with reference to FIGS. 1-3. The method includes processing a semiconductor assembly 100 by contacting the semiconductor assembly 100 with a chalcogen source. The term "semiconductor assembly" as used herein refers to an assembly of one or more layers disposed on a support, wherein at least one of the layer includes a semiconductor layer. As indicated, for example, in FIG. 1, the semiconductor assembly 100 includes a semiconductor layer 120 disposed on a support 110. In some embodiments, as indicated, for example, in FIGS. 2 and 3, one or more intervening layers (for example, a metal layer 150 or a back contact layer 160) may be further interposed between the support 110 and the semiconductor layer 120. The term "semiconductor layer" as used herein refers to a layer including a semiconductor material.

In some embodiments, the semiconductor layer 120 may function as an absorber layer in a photovoltaic device. The term "absorber layer" as used herein refers to a semiconducting layer wherein the solar radiation is absorbed. In one embodiment, a photoactive material is used for forming the absorber layer 120. Suitable photo-active materials include cadmium telluride (CdTe), cadmium zinc telluride (CdZnTe), cadmium magnesium telluride (CdMgTe), cadmium manganese telluride (CdMnTe), cadmium sulfur telluride (CdSTe), zinc telluride (ZnTe), copper indium disulfide (CIS), copper indium diselenide (CISe), copper indium gallium sulfide (CIGS), copper indium gallium diselenide (CIGSe), copper indium gallium sulfur selenide (CIGSSe), copper indium gallium aluminum sulfur selenide ($Cu(In,Ga,Al)(S,Se)_2$), copper zinc tin sulfide (CZTS), or combinations thereof. The above-mentioned photo-active semiconductor materials may be used alone or in combination. Further, these materials may be present in more than one layer, each layer having different type of photo-active material or having combinations of the materials in separate layers. In certain embodiments, the semiconductor layer 120 includes cadmium telluride (CdTe).

In some embodiments, the semiconductor assembly 100 may be pre-fabricated. In some other embodiments, the method may further include the step of disposing the semiconductor layer 120 on the support 110 to form the semiconductor assembly 100. In some embodiments, the method includes the step of disposing the semiconductor layer 120 on the support 110 by suitable deposition techniques, such as, for example, close-space sublimation (CSS), vapor transport deposition (VTD), ion-assisted physical vapor deposition (IAPVD), atmospheric plasma chemical vapor deposition (APCVD), radio frequency or pulsed magnetron sputtering (RFS or PMS), plasma enhanced chemical vapor deposition (PECVD), electrochemical deposition (ECD), or combinations thereof. In embodiments wherein the semiconductor assembly further includes one or more intervening layers between the semiconductor layer 120 and the support 110, the method may further include the step(s) of disposing the intervening layer(s) on the support, and the semiconductor layer 120 may be disposed on the intervening layer using one or more of a suitable deposition technique.

As noted earlier, the method further includes the step of contacting at least a portion of a semiconductor assembly 100 with a chalcogen source. The term "chalcogen" as used herein refers to selenium, sulfur, or combinations thereof. The term chalcogen source as used herein refers to a material including the chalcogen in its elemental form or as a compound (such as, for example, a selenide or a sulfide). In some embodiments, the chalcogen source includes cadmium sulfide, oxygenated cadmium sulfide, cadmium sulfite, cadmium sulfate, cadmium selenide, hydrogen sulfide, hydrogen selenide, or combinations thereof. In certain embodiments, the method further includes the step of contacting at least a portion of the semiconductor assembly 100 with a sulfur source. In certain embodiments, the chalcogen source includes cadmium sulfide, oxygenated cadmium sulfide, cadmium sulfite, cadmium sulfate, or combinations thereof.

The terms "contacting" or "contacted" as used herein means that at least a portion of the semiconductor assembly is exposed to, such as, in physical contact with a suitable chalcogen source. In some embodiments, a surface of the semiconductor layer 120 may be contacted with the chalcogen source, for example using a surface treatment technique. In some other embodiments, a substantial portion of the semiconductor layer 120 may be contacting with the chalcogen source, for example, using an immersion treatment.

The step of contacting at least a portion of the semiconductor assembly 100 with the chalcogen source may include any suitable technique, such as, for example, physical vapor deposition (PVD), atomic layer deposition (ALD), chemical bath deposition (CBD), electrochemical deposition (ECD), chemical vapor deposition (CVD), close-space sublimation (CSS), or combinations thereof.

The portion of the semiconductor assembly contacted with the chalcogen source may depend, in part, on the physical form of the chalcogen source during the contacting step. In some embodiments, the chalcogen source is in the form of a solid, a solution, a suspension, a paste, vapor, or combinations thereof. Thus, by way of example, in some embodiments, the chalcogen source may be in the form of a paste, and the method may include depositing a paste of the chalcogen source on a surface of the semiconductor layer 110. In some other embodiments, for example, the chalcogen source may be in the form of a vapor, and the method may include depositing the chalcogen source using a suitable vapor deposition technique.

Figure 2:
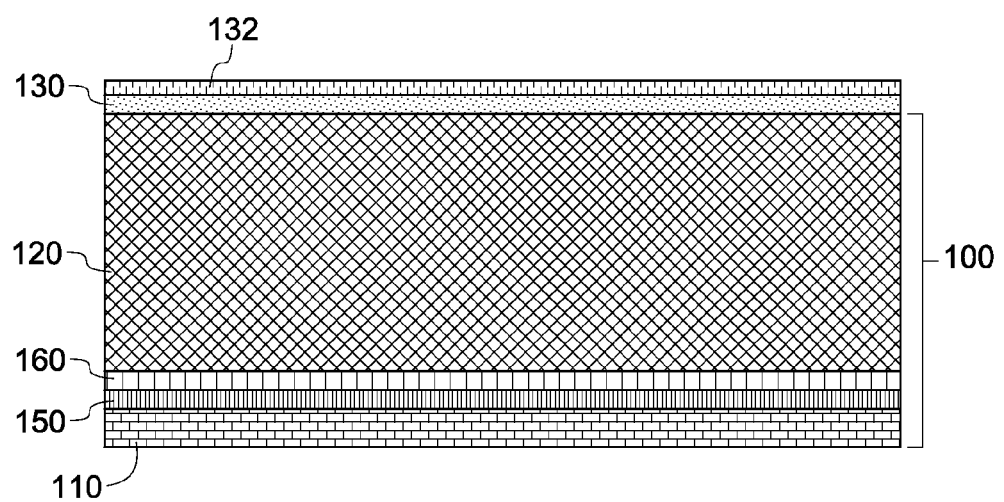
FIG. 2 is a schematic of a semiconductor assembly, in accordance with some embodiments of the invention.

In some embodiments, the step of contacting at least a portion of the semiconductor material with a chalcogen source includes disposing a chalcogen source layer 130 in contact with the semiconductor layer 120, as indicated in FIGS. 1 and 2. In certain embodiments, the method includes the step of disposing the chalcogen source layer 130 on the semiconductor layer 120 by physical vapor deposition. In certain embodiments, the method includes the step of disposing the chalcogen source layer 130 on the semiconductor layer 120 by sputtering.

A suitable thickness of the chalcogen source layer 130 may be in a range from about 10 nanometers to about 400 nanometers, in some embodiments. In some embodiments, the chalcogen source layer 130 may have a thickness in a range from about 20 nanometers to about 200 nanometers. The chalcogen source layer may have a uniform thickness, in some embodiments. In some other embodiments, the chalcogen source layer may have a varying thickness, and the term "thickness" as used in this context may refer to an average thickness of the chalcogen source layer 130.

In some embodiments, contacting of the assembly 100 with a chalcogen source further includes thermally processing the assembly 100 at a treatment temperature and for time duration sufficient to allow incorporation of the chalcogen into at least a portion of the semiconductor material resulting in a semiconductor layer 120 having the desired electrical and optical properties.

In some embodiments, thermally processing the semiconductor assembly 100 includes heating the semiconductor assembly 100 at a temperature greater than about 600 degrees Celsius. In some embodiments, thermally processing the semiconductor assembly 100 includes heating the semiconductor assembly 100 at a temperature in a range from about 600 degrees Celsius to about 700 degrees Celsius. In some embodiments, thermally processing the semiconductor assembly 100 includes heating the semiconductor assembly 100 at a temperature in a range from about 630 degrees Celsius to about 700 degrees Celsius. In some embodiments, the semiconductor assembly 100 may be heated to the desired temperature, such as in a furnace or oven, or through the use of a heat lamp, laser, or other source of heat The semiconductor assembly 100 is generally maintained or "held" at a temperature within the desired range for a desired time. In some embodiments, thermal processing is performed for a time duration in a range from about 2 minutes to about 40 minutes. In some embodiments, thermal processing is performed for a time duration in a range from about 5 minutes to about 20 minutes. Those skilled in the art will appreciate that the time desired to effect the chalcogen incorporation into the semiconductor material depends in part on the selected thermal processing temperature, with longer times generally used for lower temperatures.

In some embodiments, the method may further include disposing a capping layer 132 on the chalcogen source layer 130 prior to the thermal processing step. The term "capping layer" as used herein refers to a layer of material that precludes or minimizes the sublimation of one or more constituents of the chalcogen source layer 130 during the thermal processing step. In some embodiments, the capping layer 132 may include a material having a lower affinity for the chalcogen than the semiconductor material in the semiconductor layer 120.

In some embodiments, the capping layer 132 includes a material suitable to preclude diffusion of chalcogen from the chalcogen source layer 130. In some embodiments, the capping layer 132 includes an oxide. In some embodiments, the capping layer includes tin oxide. A suitable thickness of the capping layer 132 may be in a range from about 10 nanometers to about 500 nanometers, in some embodiments. In some embodiments, the capping layer 132 may have a thickness in a range from about 20 nanometers to about 200 nanometers.

As noted earlier, the method further includes introduction of the chalcogen from the chalcogen source into at least a portion of the semiconductor material. The term "introduced" as used herein includes introduction of the chalcogen into the semiconductor material in its elemental form (for example, as a dopant) or as a compound (for example, a sulfide). In some embodiments, the chalcogen may form a binary or a ternary compound with the semiconductor material. Thus, by way of example, in some exemplary embodiments, introduction of sulfur into a cadmium telluride (CdTe) semiconductor material may result in formation of cadmium sulfide, cadmium sulfur telluride, or combinations thereof. In certain embodiments, introduction of sulfur into the CdTe semiconductor material may result in formation of cadmium sulfur telluride, $CdS_xTe_{(1-x)}$, wherein x is greater than 0 and less than 1. In certain embodiments x is in a range from about 0.03 to about 0.1.

Further, the amount of chalcogen introduced into the semiconductor material may be either substantially uniform or may vary across the thickness of the semiconductor layer 120. In some embodiments, the chalcogen is introduced into at least a portion of the semiconductor material such that an average atomic concentration of the chalcogen in the semiconductor material is substantially constant across the thickness of the semiconductor layer 120. The term "atomic concentration" as used herein refers to the number of atoms per unit volume. The term "substantially constant" as used herein means that a variance in the average atomic concentration of the chalcogen is less than about 5 percent across the thickness of the semiconductor layer 120.

In some embodiments, the chalcogen is introduced into at least a portion of the semiconductor material such that an average atomic concentration of the chalcogen in the semiconductor layer 120 varies across the thickness of the semiconductor layer. In certain embodiments, an average atomic concentration of the chalcogen in the semiconductor layer decreases in a direction away from the window layer 140 (front interface) and towards the support 110 (back interface). In some embodiments, an average atomic concentration of the chalcogen in the semiconductor layer continuously decreases in a direction away from the window layer 140 (front interface) and towards the support 110 (back interface). In some other embodiments, there is a step-wise decrease in the average atomic concentration of the chalcogen in the semiconductor layer. In certain embodiments, the method includes introducing sulfur into at least a portion of the semiconductor material such that an average atomic concentration of sulfur in the semiconductor material decreases in a direction away from the window layer 140 (front interface) and towards the support 110 (back interface).

Without being bound by any theory, it is believed that the introduction of chalcogen into the semiconductor material may decrease the bandgap, which may contribute to a higher short circuit current ($J_{SC}$) and efficiency of a photovoltaic device. Further, without being bound by any theory, it is believed by controlling the concentration profile of the chalcogen introduced into the absorber material, the resulting band gap profile of the absorber layer may be controlled. In certain embodiments, wherein the chalcogen is primarily introduced near the front interface (proximate to the window layer), the semiconductor layer may have a graded band gap profile, such that the short-circuit current ($J_{SC}$) increases while the open-circuit voltage ($V_{OC}$) remains substantially unaffected.

Those skilled in the art will appreciate that the amount of chalcogen incorporated into the semiconductor material may depend at least in part on one or more of the chalcogen source composition, chalcogen source layer thickness, thermal processing conditions (temperature and time), or the semiconductor layer thickness. In some embodiments, the amount of chalcogen incorporated into the semiconductor material maybe in a range from about 2 weight percent to about 10 weight percent of the semiconductor material. In some embodiments, the amount of chalcogen incorporated into the semiconductor material maybe in a range from about 4 weight percent to about 9 weight percent of the semiconductor material.

In some embodiments wherein the chalcogen source is disposed as a chalcogen source layer 130 on the semiconductor layer 120, a substantial portion of the chalcogen may be incorporated in the semiconductor material, and the chalcogen source layer 130 may be substantially consumed. The terms "substantial portion" or "substantially consumed" as used in this context means that at least about 80 weight percent of the original chalcogen source is incorporated into the semiconductor layer. In some embodiments wherein the chalcogen source is disposed as a layer on the semiconductor layer, the term "substantially consumed" as used in this context means that at least about 80 percent of the thickness of the chalcogen source layer is consumed. In such embodiments, an additional step of removing the chalcogen source may not be required.

In some embodiments, a portion of the chalcogen source may remain unconsumed after the step of introducing the chalcogen into the semiconductor material. In such embodiments, the method may further include an additional step of removing the chalcogen source. In embodiments wherein the chalcogen source is disposed as a chalcogen source layer, the method may further include the step of removing the chalcogen source layer before the step of disposing a window layer, as discussed below. In some embodiments, wherein a capping layer is employed, the method may further include the step of removing the capping layer prior to the step of disposing the window layer. Suitable non-limiting examples of techniques for removing the capping layer or the chalcogen source layer may include, chemical treatment (for example, etching), plasma treatment, ablation, or combinations thereof.

The method further includes disposing a window layer 140 on the semiconductor layer 120 after the step of introducing the chalcogen into at least a portion of the semiconductor material. As noted earlier, in certain embodiments, the method may include the step(s) of removing the chalcogen source layer 130 or the capping layer 132. In such embodiments, the method includes the step of disposing the window layer 140 on the semiconductor layer 120 after the chalcogen source layer 130 and the capping layer 132 (if present) are removed.

The term "window layer" as used herein refers to a semiconducting layer that is substantially transparent and is capable of forming a heterojunction with the first semiconductor layer 120. As described later, in some embodiments, the window layer may further function as a front contact and a separate front contact layer may not be required. In some embodiments, the window layer 140 and the semiconductor layer 120 may be doped with a p-type dopant or an n-type dopant to form a heterojunction. In some embodiments, the window layer 140 includes an n-type semiconductor material. In such embodiments, the semiconductor layer 120 may be doped to be p-type to form an "n-p" heterojunction. In some embodiments, the window layer 140 may be doped to be n-type and the semiconductor layer 120 may be doped such that it effectively forms an n-i-p configuration, using a p+-semiconductor layer on the backside of the semiconductor layer 120. In another embodiment the absorber layer may be doped such that it has an intrinsic type region near the front interface and a p-type region near the back interface, effectively forming an n-i-p configuration.

In some embodiments, a window layer includes a metallic species and a non-metallic species. The metallic species include zinc, magnesium, tin, or combinations thereof and the non-metallic species include sulfur, oxygen, sulfur, hydrogen, or combinations thereof. Suitable non-limiting examples of a window layer material include ZnO, ZnOS, Zn(O,S,H), MgO, SnO, or combinations thereof. The above-mentioned window layer materials may be used alone or in combination. Further, these materials may be present in more than one layer, each layer having different type of material or having combinations of the materials in separate layers. In certain embodiments the window layer may include a bi-layer structure including different materials, wherein a first layer may function as a transparent conductive layer and a second layer may function as a buffer layer (sometimes referred to in the art as a highly-resistive transparent conductive oxide layer).

In certain embodiments, the window layer is substantially free of cadmium sulfide. The term "substantially free" as used in this context means that the amount of cadmium sulfide in the window layer is less than about 5 weight percent. Embodiments of the present invention may advantageously allow for de-coupling of the chalcogen introduction step and the window layer deposition step. Without being bound by any theory, it is believed that by performing the two steps independently, the band-gap of the absorber layer material may be modified (resulting in a $J_{SC}$ increase) first by introducing the chalcogen in the desired amount, which may be followed by formation of a separate window layer optimized for interface passivation and optical properties. Further, by controlling the concentration profile of the chalcogen introduced into the absorber material, the resulting band gap profile of the absorber layer may be controlled such that the $V_{OC}$ remains substantially unaffected.

In some embodiments, the window layer has a thickness in a range from about 10 nanometers to about 500 nanometers. In some embodiments, the window layer has a thickness in a range from about 20 nanometers to about 200 nanometers.

In some embodiments, the method includes the step of disposing the window layer 140 on the semiconductor layer 120 by suitable deposition techniques, such as, for example, physical vapor deposition (PVD), atomic layer deposition (ALD), chemical bath deposition (CBD), electrochemical deposition (ECD), chemical vapor deposition (CVD), close-space sublimation (CSS), or combinations thereof.

Figure 3:
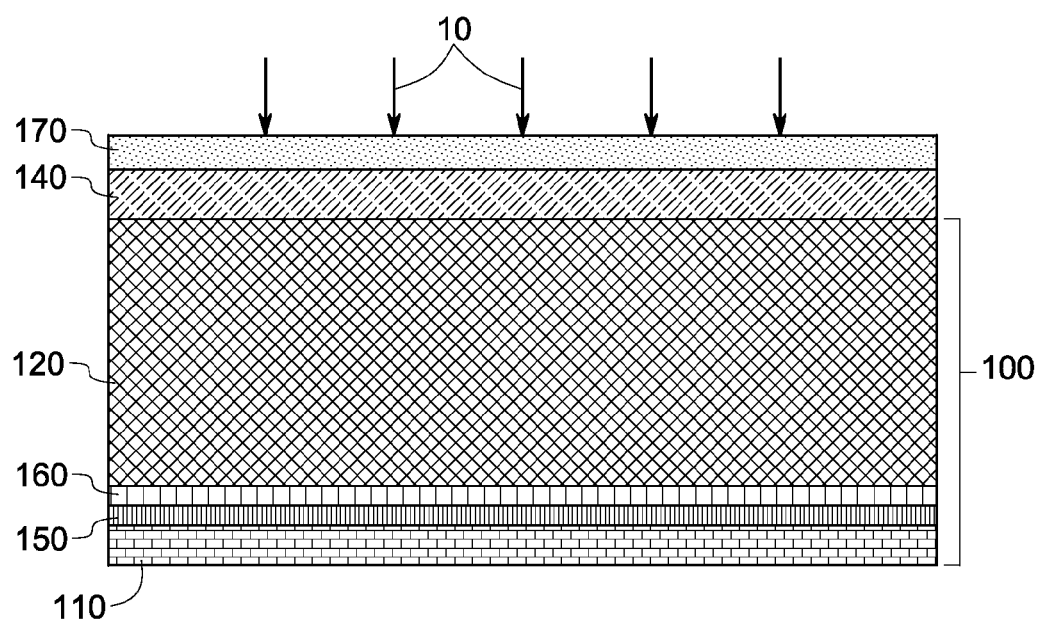
FIG. 3 is a schematic of a photovoltaic device, in accordance with some embodiments of the invention.

As noted earlier, a method of processing a semiconductor assembly 100 suitable for a photovoltaic device 200 including a "substrate" configuration is presented. In such embodiments, as illustrated in FIG. 3, the semiconductor assembly 100 includes a metal layer 150 and an optional back contact layer 160 disposed on a support 110. A semiconductor layer (sometimes referred to in the art as absorber layer) 120 is further disposed on the back contact layer 160 and a window layer 140 is disposed on the semiconductor layer 120. In some embodiments, as indicated in FIG. 3, the photovoltaic device may further include a transparent layer 170 disposed on the window layer 140, wherein the transparent layer 170 forms a front contact. In some other embodiments, the window layer 140 may itself function as a front contact and a separate front contact may not be required (embodiment not shown).

As illustrated in FIG. 3, in such embodiments, the solar radiation 10 enters from the transparent layer 170 or directly from the window layer 140 (embodiment not shown), and after passing through the window layer 140, enters the semiconductor layer 120, where the conversion of electromagnetic energy of incident light (for instance, sunlight) to electron-hole pairs (that is, to free electrical charge) occurs.

The support 110 may include a substantially transparent material or a substantially opaque material. In embodiments, wherein the substrate includes a substantially transparent material, the photovoltaic device 200 may include a bi-facial configuration such that the solar radiation may enter from one or both of the support 110 or the transparent layer 170 (embodiment not shown). In such embodiments, the device 200 may further include an optional transparent layer (not shown)

interposed between the support 110 and the semiconductor layer 120. In some embodiments, the support 110 includes a material capable of withstanding heat treatment temperatures greater than about 600° C., such as, for example, silica or borosilicate glass.

In some embodiments, the transparent layer 170 (optional) includes a transparent conductive oxide (TCO). Non-limiting examples of transparent conductive oxides include cadmium tin oxide (CTO), indium tin oxide (ITO), fluorine-doped tin oxide (SnO:F or FTO), indium-doped cadmium-oxide, cadmium stannate ($Cd_2SnO_4$ or CTO), doped zinc oxide (ZnO), such as aluminum-doped zinc-oxide (ZnO:Al or AZO), indium-zinc oxide (IZO), zinc tin oxide ($ZnSnO_x$), cadmium magnesium oxide (CdMgO), gallium oxide (GaO), or combinations thereof.

The metal layer 150 may include gold, platinum, molybdenum, tungsten, tantalum, palladium, aluminum, chromium, nickel, silver, or combinations thereof. The back contact layer 160 may include a suitable heat-resistant back contact material, such as, for example, copper telluride, zinc telluride, molybdenum telluride, lead telluride, manganese telluride, magnesium telluride or combinations thereof.

Referring again to FIG. 3, in some embodiments, the method includes disposing one or more intervening layers (for example, the layers 150 or 160) between the support 110 and the semiconductor layer 120 before the step of disposing the semiconductor layer 120 using a suitable technique as described earlier. The method further includes processing the semiconductor assembly 100 as described earlier followed by the step of disposing a window layer 140 on the semiconductor layer 120. In some embodiments, the method may further include disposing a transparent layer 170 (optional) on the window layer 140 by any suitable technique, such as sputtering, chemical vapor deposition, spin coating, spray coating, or dip coating to complete the photovoltaic device 200.

EXAMPLES

Example 1

Preparation of CdTe/CdS/ZnO/FTO/Glass Sample

A multi-layered sample (Sample 1) was prepared by depositing cadmium tin oxide (CTO) on a glass support followed by deposition of zinc tin oxide (ZTO) layer on the CTO. Cadmium sulfide (5 molar % oxygen in the CdS layer) was then deposited on the ZTO layer by DC sputtering followed by deposition of cadmium telluride (CdTe) layer.

Example 2

Annealing of CdTe/CdS/ZnO/FTO/Glass Sample

The multi-layered sample (Sample 1) prepared in Example 1 was subjected to an annealing step at 630° C. for 10 min in a nitrogen ($N_2$) atmosphere at 100 Ton using face-to-face annealing to form Sample 2. The photovoltaic cells were completed by subjecting the cells to back-contact treatment steps.

Figure 4:
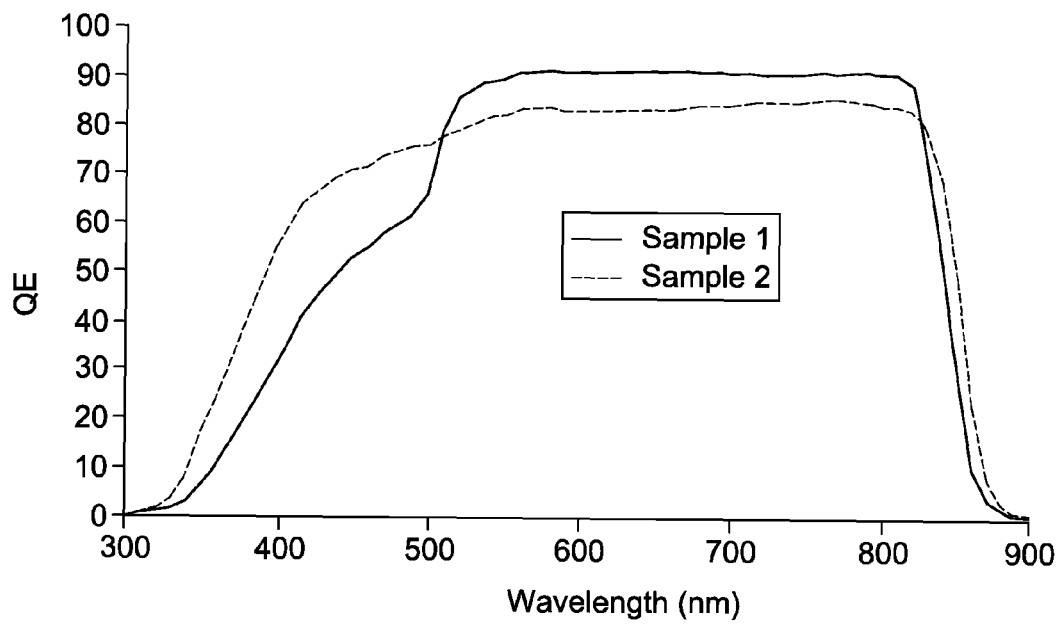
FIG. 4 shows the quantum efficiency (QE) curves for photovoltaic devices, in accordance with some embodiments of the invention.
Figure 5:
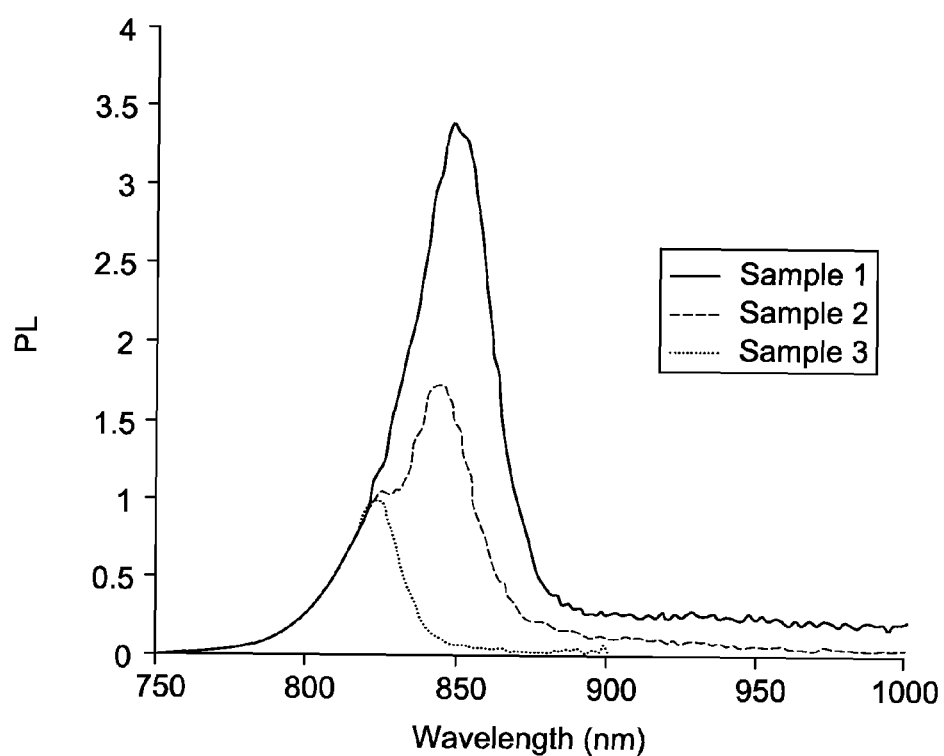
FIG. 5 shows the photoluminescence (PL) spectra for photovoltaic devices, in accordance with some embodiments of the invention.

FIG. 4 shows that the quantum efficiency curve for Sample 2 (sample subjected to anneal step) is wider than the quantum efficiency curve for Sample 1 (no annealing step), indicating that the band-gap of the CdTe material after the annealing step (Sample 2) is lowered, which may result in increased $J_{SC}$. FIG. 5 shows that the photoluminescence (PL) peak for the ternary compound cadmium sulfur telluride (CdSTe) in Sample 2 is increased and shifted when compared to the PL peak for CdSTe in Sample 1, indicating that there is higher formation of the CdSTe in Sample 2. Further, measurement from the back (Sample 3) indicates that there is no ternary phase in the back interface and the ternary phase is primarily formed at the interface between CdS and CdTe, further indicating a graded CdSTe profile in the CdTe layer.

The appended claims are intended to claim the invention as broadly as it has been conceived and the examples herein presented are illustrative of selected embodiments from a manifold of all possible embodiments. Accordingly, it is the Applicants' intention that the appended claims are not to be limited by the choice of examples utilized to illustrate features of the present invention. As used in the claims, the word "comprises" and its grammatical variants logically also subtend and include phrases of varying and differing extent such as for example, but not limited thereto, "consisting essentially of" and "consisting of." Where necessary, ranges have been supplied; those ranges are inclusive of all sub-ranges there between. It is to be expected that variations in these ranges will suggest themselves to a practitioner having ordinary skill in the art and where not already dedicated to the public, those variations should where possible be construed to be covered by the appended claims. It is also anticipated that advances in science and technology will make equivalents and substitutions possible that are not now contemplated by reason of the imprecision of language and these variations should also be construed where possible to be covered by the appended claims.

The invention claimed is:

1. A method, comprising:
   (a) contacting at least a portion of a semiconductor assembly with a chalcogen source, wherein the semiconductor assembly comprises a semiconductor layer comprising a semiconductor material disposed on a support, wherein the step (a) comprises disposing a chalcogen source layer comprising the chalcogen source in contact with the semiconductor layer;
   (b) introducing a chalcogen from the chalcogen source into at least a portion of the semiconductor material;
   (c) removing the chalcogen source layer; and
   (d) disposing a window layer on the semiconductor layer after the steps (b) and (c).

2. The method of claim 1, wherein the window layer is substantially free of cadmium sulfide.

3. The method of claim 1, wherein the window layer comprises a metallic species and a non-metallic species, wherein the metallic species comprises zinc, magnesium, tin, or combinations thereof and the non-metallic species comprises oxygen, sulfur, hydrogen, or combinations thereof.

4. The method of claim 1, wherein the chalcogen comprises sulfur, selenium, or combinations thereof.

5. The method of claim 1, wherein the chalcogen source comprises cadmium sulfide, oxygenated cadmium sulfide, cadmium sulfite, cadmium sulfate, cadmium selenide, hydrogen sulfide, hydrogen selenide, or combinations thereof.

6. The method of claim 1, wherein the chalcogen source comprises cadmium sulfide, oxygenated cadmium sulfide, cadmium sulfite, cadmium sulfate, or combinations thereof.

7. The method of claim 1, wherein the step of contacting the semiconductor assembly with a chalcogen source comprises physical vapor deposition, atomic layer deposition, chemical bath deposition, electrochemical deposition, chemical vapor deposition, close-space sublimation, or combinations thereof.

8. The method of claim 1, wherein the chalcogen source layer has a thickness in a range from about 20 nanometers to about 200 nanometers.

9. The method of claim 1, wherein the step (a) further comprises heating the semiconductor assembly at a temperature greater than about 600 degrees Celsius.

10. The method of claim 1, wherein the step (a) further comprises heating the semiconductor assembly at a temperature in a range from about 600 degrees Celsius to about 700 degrees Celsius.

11. The method of claim 1, wherein the step (b) comprises introducing the chalcogen into at least a portion of the semiconductor material such that an average atomic concentration of the chalcogen in the semiconductor layer decreases in a direction away from the window layer and towards the support.

12. The method of claim 1, wherein the step (b) comprises introducing the chalcogen into at least a portion of the semiconductor material such that an average atomic concentration of the chalcogen is substantially constant across the thickness of the semiconductor layer.

13. The method of claim 1, further comprising disposing a capping layer on the chalcogen source layer.

14. The method of claim 13, further comprising removing the cap layer and the chalcogen source layer prior to the step of disposing a window layer.

15. The method of claim 1, wherein the step (d) of disposing the window layer comprises physical vapor deposition, atomic layer deposition, chemical bath deposition, electrochemical deposition, chemical vapor deposition, close-space sublimation, or combinations thereof.

16. The method of claim 1, wherein the semiconductor material comprises cadmium telluride, zinc telluride, magnesium telluride, cadmium zinc telluride, cadmium sulfur telluride, cadmium manganese telluride, cadmium magnesium telluride, or combinations thereof.

17. A method, comprising:
   (a) contacting at least a portion of a semiconductor assembly with a chalcogen source, wherein the semiconductor assembly comprises a semiconductor layer comprising a semiconductor material disposed on a support;
   (b) disposing a layer comprising the chalcogen source in contact with at least a portion of the semiconductor layer;
   (c) introducing a chalcogen from the chalcogen source into at least a portion of the semiconductor material;
   (d) removing the chalcogen source layer; and
   (e) disposing a window layer on the semiconductor layer after the steps (c) and (d), wherein the window layer is substantially free of cadmium sulfide.

* * * * *